United States Patent [19]

Ogura

[11] Patent Number: 4,613,381
[45] Date of Patent: Sep. 23, 1986

[54] METHOD FOR FABRICATING A THYRISTOR

[75] Inventor: Tsuneo Ogura, Kamakura, Japan

[73] Assignee: Kabushiki Kaisha Toshiba, Kawasaki, Japan

[21] Appl. No.: 644,257

[22] Filed: Aug. 27, 1984

[30] Foreign Application Priority Data

Nov. 30, 1983 [JP] Japan .................... 58-224075

[51] Int. Cl.⁴ .................................... H01L 21/225
[52] U.S. Cl. .................................. 148/1.5; 148/189
[58] Field of Search .......................... 148/1.5, 189

[56] References Cited

U.S. PATENT DOCUMENTS 3,821,038  6/1974  Shwuttke .......... 148/DIG. 55
4,370,180  1/1983  Azuma et al. .......... 148/189

FOREIGN PATENT DOCUMENTS 102864  8/1979  Japan .......... 148/189
43863   3/1980  Japan .......... 148/189
66628   4/1982  Japan .......... 148/189

OTHER PUBLICATIONS

Schwettmann et al., "Carrier Profile Change for Phosphorus-Diffused Layers on Low Temperature Heat Treatment", *Applied Phys. Lett.* 19, 7, (1971).

Ghondi, Semiconductor Power Devices, p. 278, Wiley & Sons, (1977).
Biederman et al., "Pre-Precipitation of Phosphorus in Heavily Doped Silicon", *Applied Phys. Lett.* 17, 10, (1970).
Karmonov et al., "Absence of Donor Properties of Phosphorus Diffusing in Ion Bombarded Silicon", Sov. Phys. Semicond., vol. 9, No. 9.
Ghondi, VLSI Fabrication Principles, John Wiley & Sons, 1983.

Primary Examiner—Brian E. Hearn
Assistant Examiner—John T. Callahan
Attorney, Agent, or Firm—Oblon, Fisher, Spivak, McClelland & Maier

[57] ABSTRACT

In a method for fabricating a thyristor in which n-type impurities are diffused in a p-base of a pnp wafer to form an n+-emitter, the step of diffusing the n-type impurities for forming the n+-emitter has the conditions which are set not to exceed the range where the amount of doped impurities is smaller than that which is electrically activated, thereby performing the gettering process by diffusing n-type impurities in two surfaces of the pnpn wafer in which the n+-emitter having no defects is formed. Even if a thyristor obtained by the above processes has a high off-state voltage, it has a low on-state voltage, a short turn-off time and a small variation in a reverse recovery charge.

4 Claims, 16 Drawing Figures

F I G. 1A
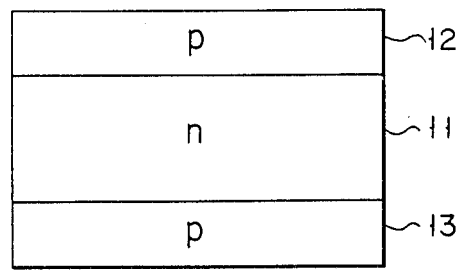
F I G. 1B
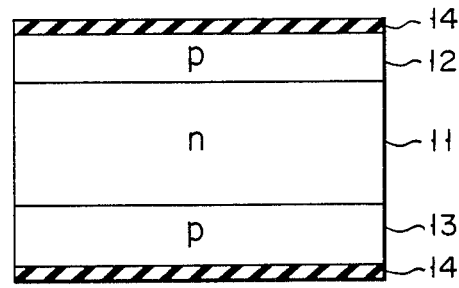
F I G. 1C
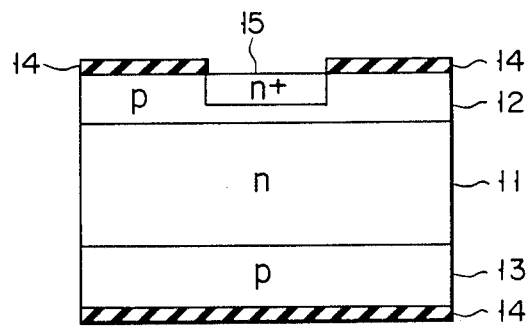
F I G. 1D
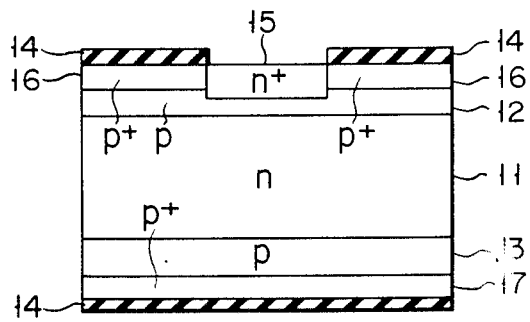

F I G. 5A
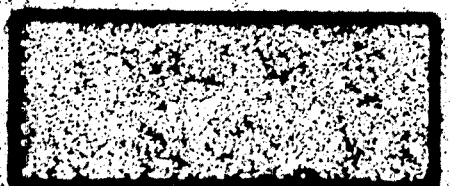
F I G. 5B
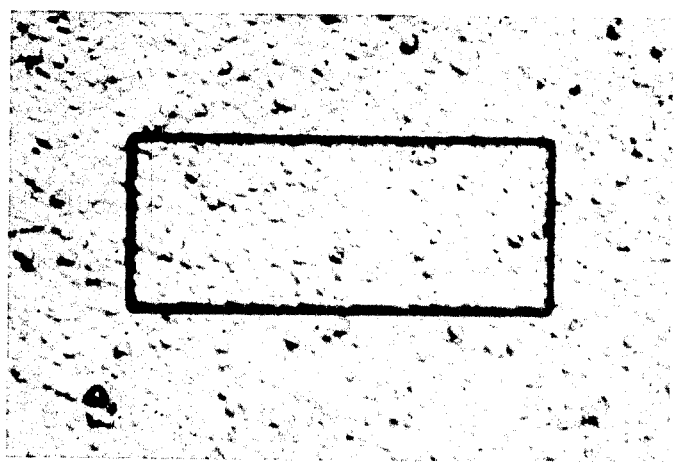

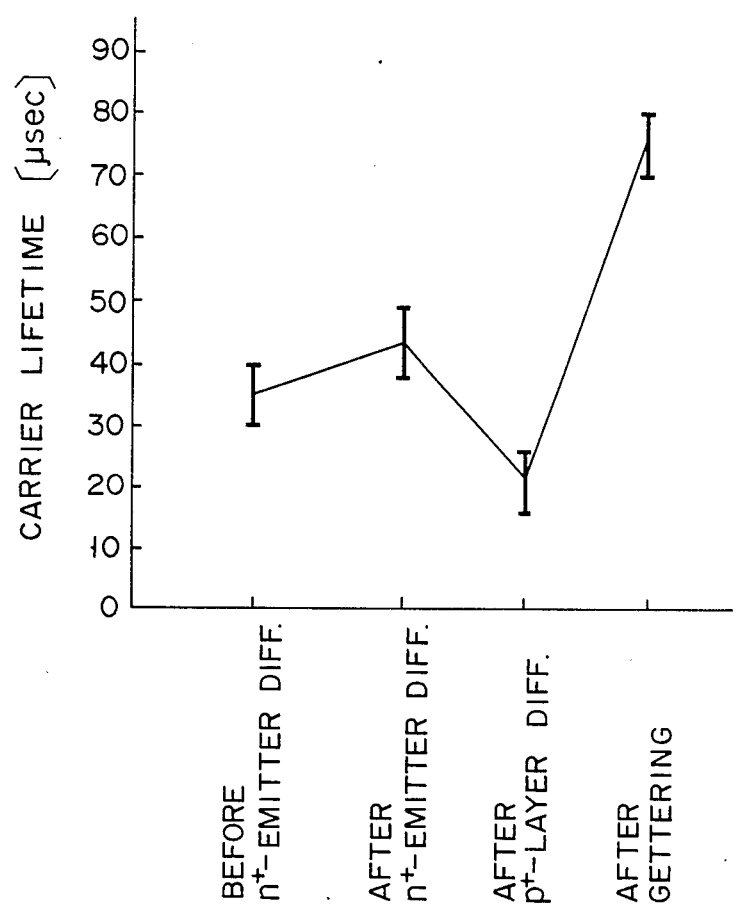
F I G. 6

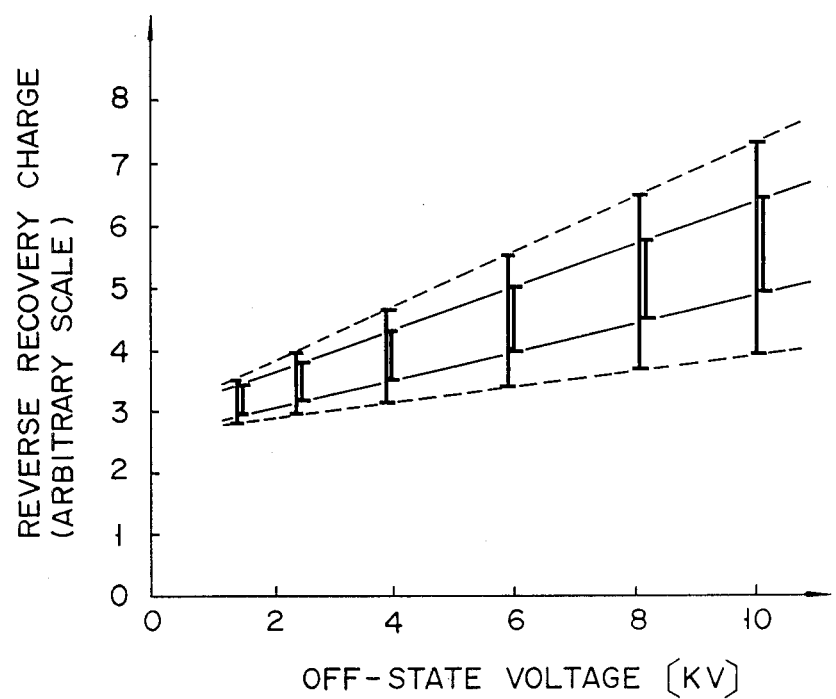
F I G. 10

METHOD FOR FABRICATING A THYRISTOR

BACKGROUND OF THE INVENTION

The present invention relates to a method for fabricating a thyristor.

A high-voltage direct-current-transmission system must be able to handle a voltage of several kilovolts to several hundred kilovolts. Such a system frequently comprises one hundred or more series-connected thyristors. A conventional single thyristor which is generally used has an off-state voltage (blocking voltage) of only about several kilovolts. When a plurality of such thyristors are used in a single system, the system is complicated in configuration. In order to provide a compact system having a small number of thyristors and improve the reliability thereof, an off-state voltage of a thyristor must be increased.

However, according to a conventional fabrication method, when an off-state voltage of a thyristor is increased above a certain limit, three important characteristics (i.e., on-state voltage (VF), turn-off time (tq) and reverse recovery charge (Qrr)) of a thyristor are also increased, thereby increasing variations in respective characteristics. In order to prevent this, the system becomes undesirably large.

The above problem will be described in detail hereafter. A conventional thyristor is fabricated in the following manner. P-type impurities are diffused in two surfaces of an n-type Si substrate to obtain a pnp wafer having a p-emitter and p- and n-bases. A portion of a surface of the p-base is etched to control the thickness thereof. Thereafter, oxide films are formed on two surfaces of the pnp wafer. A portion of one oxide film is removed by a known photoetching process. n-type impurities are selectively diffused in the p-base to form an n+-emitter. In this process, phosphorus (P) is deposited to several micrometers, and is then driven in at a high temperature. Then, the n+-emitter has a depth of about 20 μm. Thereafter, p-type impurities are diffused in two surfaces of the obtained pnpn wafer to have a high surface impurity concentration but a lower concentration than that of the n+-emitter, thereby forming a p+-layer. A heavy metal such as gold (Au) is diffused in the pnpn wafer obtained as described above. Finally, predetermined electrodes are formed on the resultant structure.

In order to increase an off-state voltage of the thyristor formed in the above manner, that is, to have a high breakdown voltage, a thickness and a resistivity of the n-base must be increased. On the other hand, a thyristor used in a direct current transmission system described above must have an on-state voltage (VF) of about 3 V or less at a current density (J) of about 100 to 150 A.cm$^{-2}$, a turn-off time (tq) of 500 μsec or less, and variations in a reverse recovery charge (Qrr) of ±20% or less. In a thyristor according to a conventional fabrication method, a maximum off-state voltage is 4 kV which satisfies the above conditions. A thyristor having an off-state voltage of more than 4 kV cannot be practically obtained.

In order to solve the above problem, the following methods have been suggested.

According to one of these methods, as described in Japanese Patent Publication No. 57-26424, gettering is performed on a pnp wafer. Thereafter, phosphorus is diffused at a low temperature to form an n+-emitter. According to another method, as described in U.S. Pat. No. 4,370,180, after forming an n+-emitter, gettering is performed on a pnpn wafer immediately before a gold diffusion process. However, according to these methods, a thyristor which satisfies the above conditions and has an off-state voltage of more than 6 kV cannot be practically obtained.

The reason for this is as follows. In the former method, the n+-emitter is formed at a low temperature after the gettering process, thereby undesirably prolonging a heating process. In this n+-emitter forming process, a plurality of defects are introduced. These defects getter a heavy metal. Therefore, a carrier lifetime of p- and n-bases in the vicinity of the n+-emitter is undesirably prolonged, thereby excessively prolonging a turn-off time of a thyristor. In the latter method, the gettering is performed after forming the n+-emitter. A plurality of defects are introduced in the same manner as the former method. In this method, a carrier lifetime is finally controlled by gold diffusion. However, since a plurality of defects trap the gold, a carrier lifetime distribution cannot be precisely controlled. Therefore, according to this method, a thyristor which has an off-state voltage of more than 6 kV and a sufficiently small on-state voltage (VF) and turn-off time (tq) cannot be obtained.

In any such method, when the n+-emitter if formed, impurities are diffused to have a high concentration. As a result, a plurality of defects are formed, thereby degrading the characteristics of a thyristor.

SUMMARY OF THE INVENTION

It is an object of the present invention to provide a thyristor having a sufficiently high off-state voltage, a low on-state voltage, a short turn-off time and small variations in reverse recovery charge.

According to a method of the present invention, p-type impurities are diffused in two surfaces of an n-type Si substrate to form a pnp waver having a p-emitter, and n- and p-bases. Thereafter, when n-type impurities are diffused in the surface of the p-base to form an n+-emitter, the amounts of doped impurities are controlled not to exceed the amounts of the impurities which are electrically activated, thereby controlling the formation of defects when the n+-emitter is formed. n-type impurities are diffused in two surfaces of the thus obtained pnpn wafer to have high concentration and to small depths, and thereafter gettering is performed.

In order to achieve control over the amounts of the impurities introduced in the case when the n+-emitter is formed, for example, a diffusion source is maintained at a low temperature, and an amount of a carrier gas is controlled.

After the gettering process and before performing gold diffusion, the pnpn wafer is heated in an inert gas at a temperature of 600° to 1,000° C. for up to 10 hours, thereby further decreasing variations in characteristics of the obtained thyristor.

According to the present invention, when the n+-emitter is formed, the defect density is controlled. As a result, a high voltage thyristor having a low on-state voltage, a short turn-off time, and small variations in reverse recovery charge can be obtained. This thyristor can be effectively employed in a high voltage direct current transmission system.

BRIEF DESCRIPTION OF THE DRAWINGS

The present invention will be described in detail with reference to the accompanying drawings hereafter.

FIGS. 1A to 1F are respectively sectional views sequentially showing a manufacturing process of a thyristor according to an embodiment of the present invention;

FIGS. 5A and 5B are respectively microphotographs showing defect distributions in the n+-emitters of the thyristors according to the conventional method and the embodiment of the present invention, respectively;

FIG. 6 is a graph showing changes in a carrier lifetime of the thyristor according to this embodiment of the present invention;

FIGS. 8 to 10 are graphs showing respective characteristics of the thyristor according to the embodiment of the present invention in comparison with those of the thyristor of the conventional method.

DETAILED DESCRIPTION OF THE PREFERRED EMBODIMENT

Figure 1E:
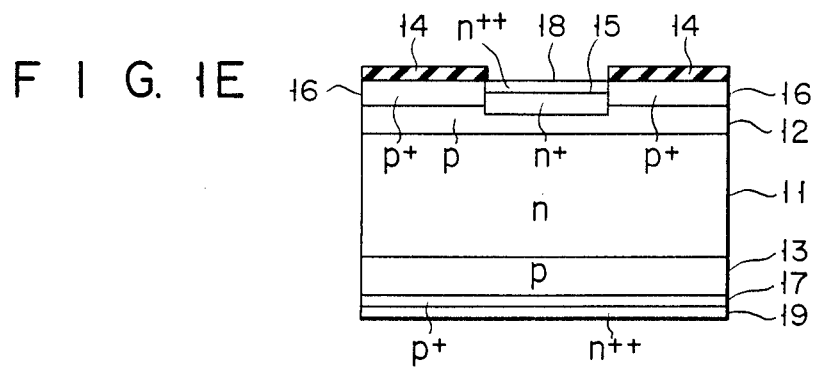

As shown in FIG. 1, p-type impurities are diffused in two surfaces of an n-type Si substrate to form a pnp wafer consisting of n- and p-bases 11 and 12 and a p-emitter 13. In this case, in order to obtain a 4-kV thyristor, the resistivity of a starting substrate, i.e., the n-base 11 is set at about 200 $\Omega$.cm, and in order to obtain a 6-kV thyristor, it is set at about 300 $\Omega$.cm. In the 4-kV thyristor, a thickness of the n-base 11 is set at about 800 $\mu$m, and in the 6-kV thyristor, it is set at about 1,100 $\mu$m. Furthermore, the p-base 12 and the p-emitter 13 have a thickness of about 80 to 150 $\mu$m and a surface impurity concentration of about $10^{19}$ cm$^{-3}$. Thereafter, in order to control a sheet resistivity of the p-base 12 and to adjust a gate sensitivity a portion of the p-base 12 is etched to have a thickness of 60 to 70 $\mu$m, as shown in FIG. 1B. Oxide (SiO$_2$) films 14 are simultaneously formed on two surfaces of the pnp wafer by thermal oxidation. Then, as shown in FIG. 1C, a portion of one of the oxide films 14 at the side of the p-base 12 is removed by a known photoetching process. Phosphorus is diffused using the remaining oxide film 14 as a mask so as to form an n+-emitter 15. The depth of the n+-emitter 15 is 5 to 20 $\mu$m.

Figure 2:
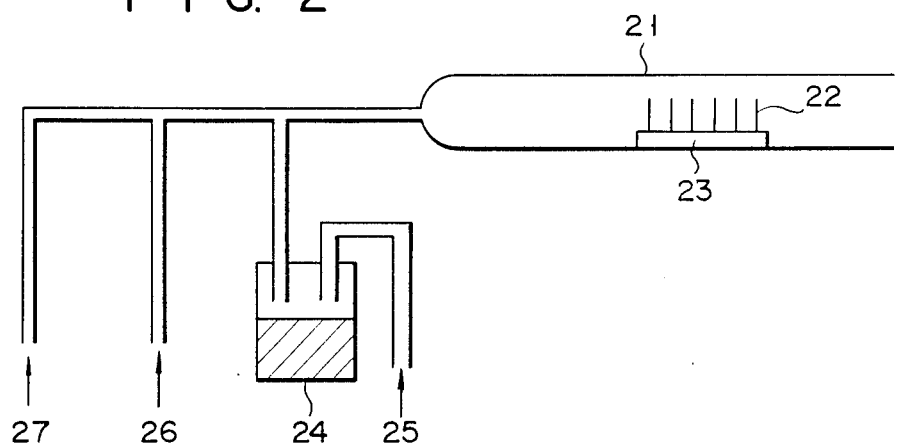
FIG. 2 is a view showing a reactor used in the step of n+-type impurity deposition according to this embodiment of the present invention.

In the process of forming the n+-emitter 15, the main feature of the present invention lies in the process of depositing the phosphorus, and it will be described in detail hereafter. This phosphorus deposition process is performed using, for example, a reactor shown in FIG. 2. In FIG. 2, reference numeral 21 denotes a reaction tube. Each pnp wafer 22 is supported on a boat 23 and is placed in the reaction tube 21. Reference numeral 24 denotes POCl$_3$ as a diffusion source; 25 denotes an N$_2$ gas for carrying the diffusion source 24; 26 denotes a O$_2$ gas; and 27 denotes a main N$_2$ gas for carrying all the diffusion source 24, the N$_2$ gas 25 and the O$_2$ gas 26. In this embodiment, the amount of the POCl$_3$ supplied as the diffusion source 24 is controlled by using this reactor, and a given amount of phosphorus which can be electrically activated is deposited. More specifically, the temperature of the diffusion source 24 is maintained at less than 5° C. Furthermore, respective relative flow rates of the N$_2$ and O$_2$ gases 25 and 26 are set at 1/20 or less of that of the main N$_2$ gas 27. After performing the phosphorus deposition described above under these conditions, the phosphorus is driven in at a temperature of 1,200° C. for 1 hour. As a result, the n+-emitter 15 has a surface impurity concentration of about $10^{20}$ cm$^{-3}$ and all the doped phosphorus is electrically activated. Almost no defects occur in the n+-emitter 15.

Thereafter, as shown in FIG. 1D, p+-layers 16 and 17 are formed on two surfaces of the pnpn wafer by diffusing, e.g., gallium (Ga) so as to provide a good ohmic contact. Since the gallium passes through the oxide film 14, the oxide films 14 do not have to be removed.

A gettering process will be described hereafter. As shown in FIG. 1E, the anode side of the oxide films 14 used for forming the n+-emitter 15 is removed, but that on the cathode side thereof is left. Then, n++-layers 18 and 19 are formed by diffusing n-type impurities such as phosphorus so as to respectively have a high impurity concentration and a shallow depth. This gettering process is performed using the reactor of FIG. 2 while maintaining the diffusion source 24 at or above room temperature. In this manner, the n++-layer 18 having a plurality of defects is formed to a depth of several micrometers from the surface of the n+-emitter 15.

The gettering process can be performed on the entire two surfaces of the pnpn wafer after removing all the oxide films 14. In this case, an n++-layer formed on the p-base 12 must be later removed.

Figure 1F:
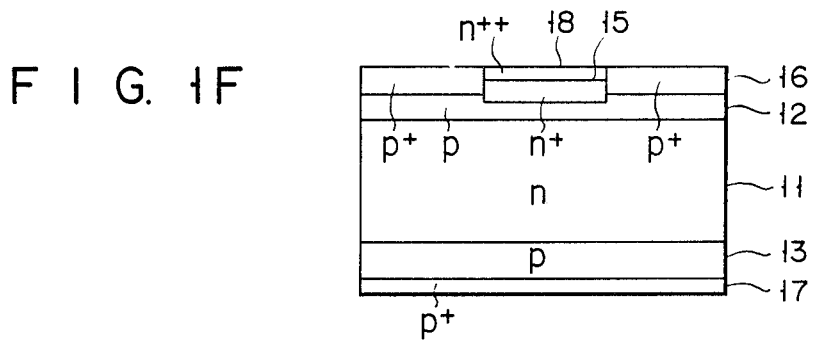

After performing the gettering process, as shown in FIG. 1F, the n++-layer 19 at the anode side is removed. Then, a heavy metal such as gold (Au) is diffused in this resultant pnpn wafer, thereby controlling a carrier lifetime of the n- and p-bases 11 and 12. In this case the n++-layer 19 can be removed after performing this carrier lifetime control process.

Finally, predetermined electrodes (not shown) are formed on the resultant wafer and then a thyristor is formed.

Figure 3:
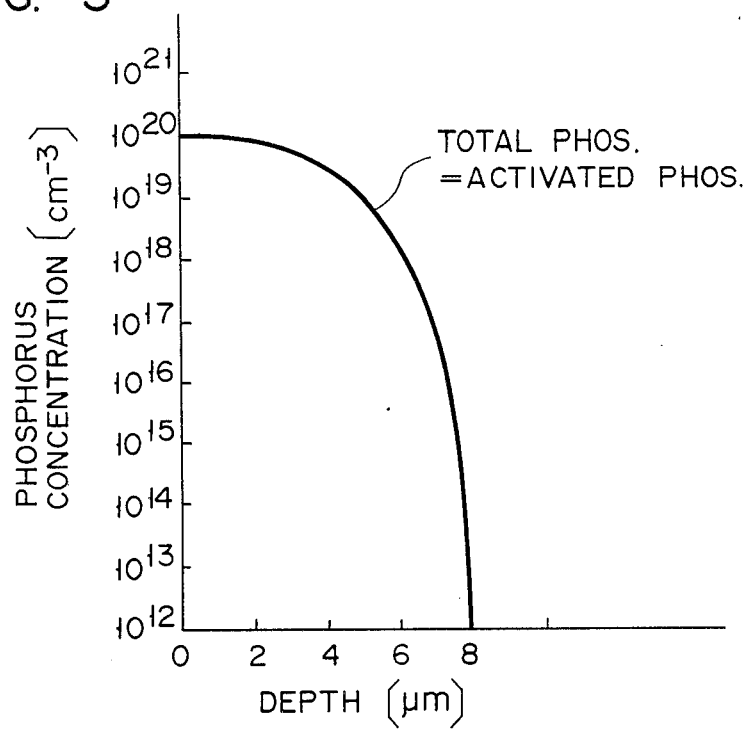
FIG. 3 is a graph showing a phosphorus concentration distribution in an n+-emitter of the thyristor according to this embodiment of the present invention.

FIG. 3 shows a phosphorus concentration distribution of the n+-emitter 15 formed according to this embodiment. The profile which represents the total amount of the phosphorus by neutron activated analysis completely coincides with that of the total amount of the electrically activated phosphorus.

Figure 4:
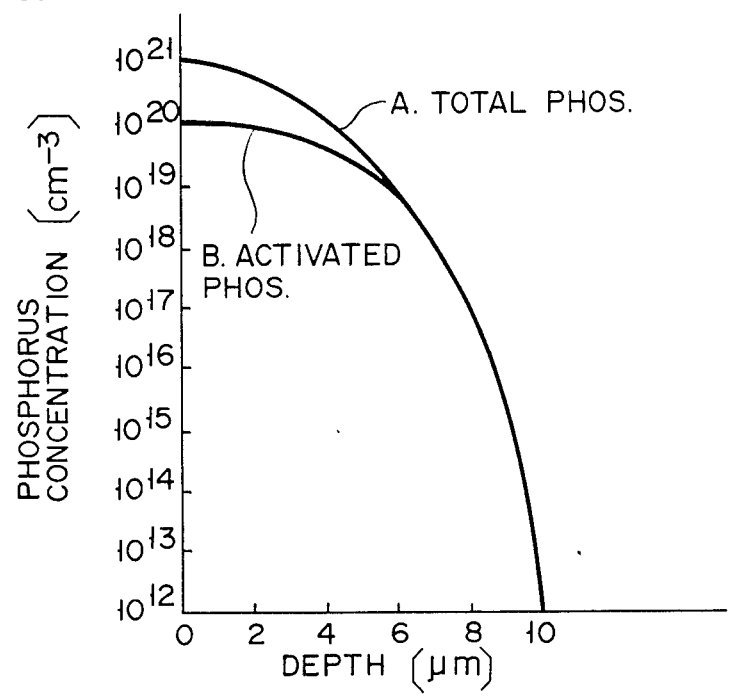
FIG. 4 is a graph showing a phosphorus concentration distribution in an n+-emitter of a thyristor according to a conventional method.

FIG. 4 shows the phosphorus concentration distribution of an n+-emitter formed according to a conventional process described in U.S. Pat. No. 4,370,180, for reference. In this case, the n+-emitter diffusion process is performed using the reactor of FIG. 2 in the following manner. The diffusion source is maintained at room temperature, and respective relative flow rates of the N$_2$ and O$_2$ gases 25 and 26 are set at ¼ of that of the main N$_2$ gas 27. Under these conditions, the phosphorus is deposited and annealed at a temperature of 1,100° C. for 1 hour. In this conventional process, as is apparent from FIG. 4, a difference between the total amount A of the phosphorus and the total amount B of the activated phosphorus can be found. In this manner, when the phosphorus is excessively doped, the n+-emitter has a plurality of defects.

FIGS. 5A and 5B are microphotographs (at a magnification of 100) respectively showing a defect distribution of the surface of the n+-emitter of the prior art having the profile shown in FIG. 4 and that of the surface of the n+-emitter of this embodiment having the profile shown in FIG. 3. In this case, the respective n+-emitters were diffused in only the rectangular portions of the respective p-bases, and then the respective surfaces thereof were etched by using a known Sirtl etching solution for detecting defects. In this state, the microphotographs described above were taken of the respective surfaces of the n+-emitters. Note that, in the microphotographs, small defects were formed by phosphorus diffusion and large defects (which look like craters) were formed by p-base diffusion. As is apparent from a comparison of these microphotographs, the n+-emitter of this embodiment has few defects.

FIG. 6 shows changes in a carrier lifetime according to this embodiment. The carrier lifetime is not increased by the n+-emitter diffusion process, but is increased after the gettering process. Thereafter, a desired carrier lifetime can be obtained by the gold diffusion process.

Figure 7:
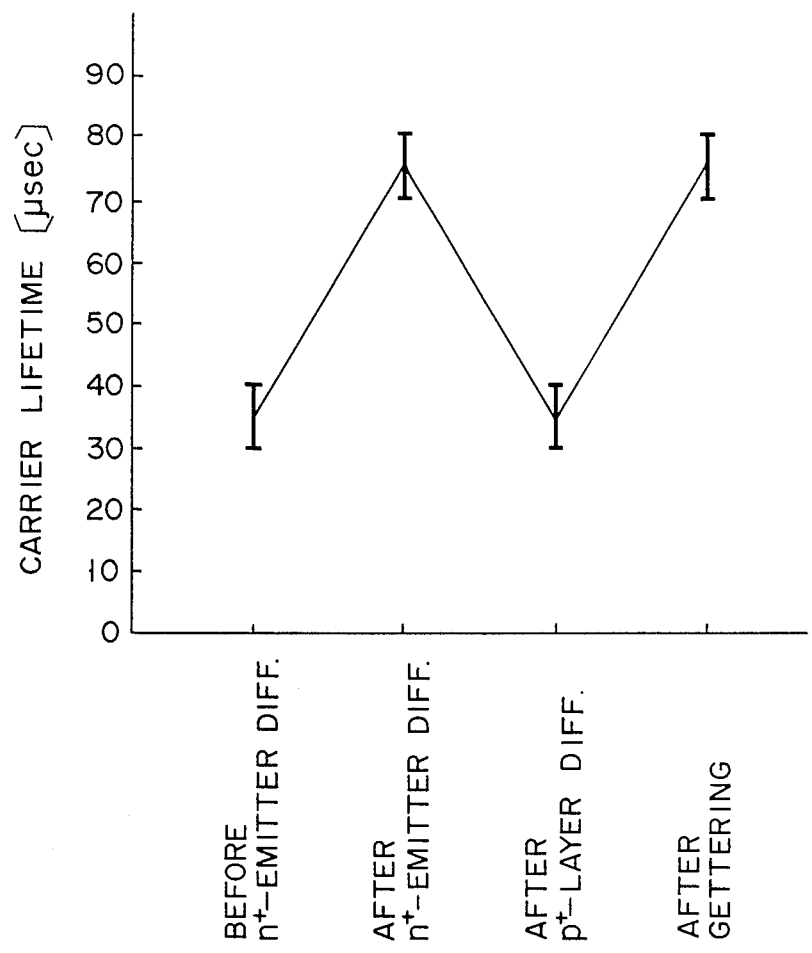
FIG. 7 is a graph showing changes in a carrier lifetime of the thyristor according to the conventional method.

On the other hand, FIG. 7 shows changes in a carrier lifetime according to the conventional process wherein the n+-emitter having the profile of FIG. 4 is formed. In this case, the carrier lifetime is greatly increased by the n+-emitter diffusion process. This results in the introduction of a great number of defects by the n+-emitter diffusion process, as described above. The increased carrier lifetime is decreased once by the p+-layer diffusion process and is increased again by the gettering process. However, the defects introduced by the n+-emitter diffusion process still remain unremoved. These defects prevent the control of the carrier lifetime by the gold diffusion process. Therefore, it is difficult to obtain the desired thyristor characteristics.

Figure 8:
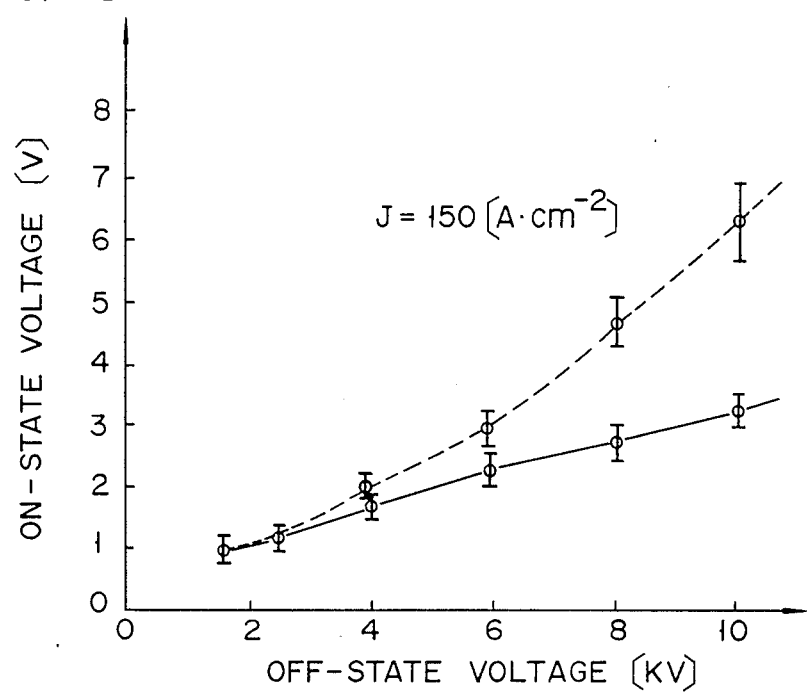
Figure 9:
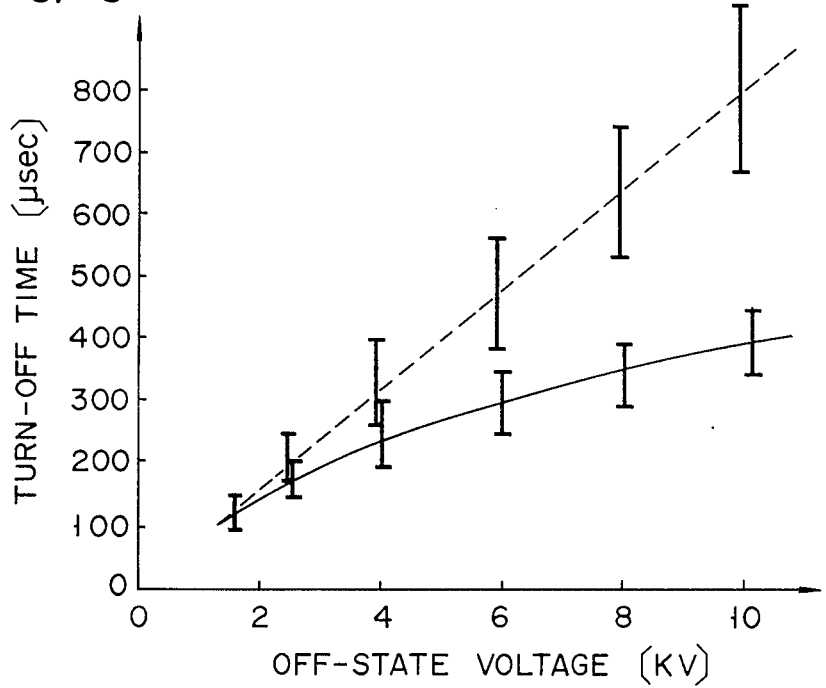

FIG. 8 shows a relationship between off-state voltages and on-state voltages of the thyristors respectively formed according to this embodiment and the prior art having the different n+-emitter diffusion process from that of the embodiment. Similarly, FIGS. 9 and 10 show relationships between off-state voltages and turn-off times and between off-state voltages and reverse recovery charges, respectively, of these thyristors. Note that in FIGS. 8 to 10, solid curves correspond to the embodiment of the present invention and dotted curves correspond to the prior art. As is apparent from these figures, the thyristor according to this embodiment has a small on-state voltage, a short turn-off time and small variations in a reverse recovery charge in comparison with those of the prior art. In particular, this effect is particularly notable in a thyristor having a large off-state voltage.

The processes shown in the present invention are merely one example, and the main feature of the present invention lies in a combination of a particular forming method of an n-emitter and gettering.

According to the present invention, after the gettering process and before the gold diffusion process, it is possible to anneal the pnpn wafer. For example, the pnpn wafer may be annealed in an inert gas at a temperature of 1,000° C. for up to 10 hours, thereby further reducing variations in the characteristics of the thyristor.

In the embodiment described above, the conditions for the n+-emitter diffusion process can be set so as to leave no inactivated n-type impurities. For example, the phosphorus deposition conditions are set as follows so as to obtain the results below. When the temperature of phosphorus diffusion is set at 900° to 1,000° C., the surface impurity concentration becomes $5 \times 10^{19}$ to $7 \times 10^{19}$ cm$^{-3}$. When the temperature of phosphorus diffusion is set at 1,000° to 1,200° C., the surface impurity concentration becomes $7 \times 10^{19}$ to $10^{20}$ cm$^{-3}$. Therefore, an n+-emitter having almost no defects can be obtained.

The present invention can be employed not only in a normal thyristor, but also in a gate turn-off thyristor (GTO), a thyristor in which a reverse conducting diode is integrally formed, a light-triggered thyristor, and the like.

What is claimed is:

1. A method for fabricating a thyristor comprising the steps of:
   (a) diffusing p-type impurities in two surfaces of an n-type silicon substrate to form a p-emitter and a p-base;
   (b) selectively diffusing n-type impurities in a surface of said p-base of a pnp wafer having said emitter and said p-base so as to form an n+-emitter having a surface impurity concentration not exceeding $10^{20}$/cm$^3$;
   (c) performing a gettering process by diffusing n-type impurities to a small depth in two surfaces of a pnpn wafer having said n+-emitter; and
   (d) diffusing a heavy metal to control a carrier lifetime in the pnpn wafer subjected to said gettering process.

2. A method according to claim 1, wherein the step (b) for forming said n+-emitter by diffusing the n-type impurities comprises depositing the n-type impurities on the pnp wafer by keeping a temperature of a diffusion source at 5° C. or less and flow rates of an O$_2$ gas and an N$_2$ gas which carries said diffusion source are set at 1/20 or less of that of a main N$_2$ gas which carries said diffusion source, said N$_2$ gas and said O$_2$ gas; and thereafter driving in (slumping) the n-type impurities.

3. A method according to claim 1, wherein the step (c) for diffusing the n-type impurities for said gettering process is performed in the state wherein a mask for forming said n+-emitter is left at the cathode side, thereby obtaining said n+-emitter having a plurality of defects from the surface thereof to a depth of several micrometers and having few defects below several micrometers.

4. A method for fabricating a thyristor comprising the steps of:
   (a) diffusing p-type impurities in two surfaces of an n-type silicon substrate to form a p-emitter and a p-base;
   (b) selectively diffusing n-type impurities in a surface of a p-base of a pnp wafer having said p-emitter and said p-base to form an n+-emitter so as not to exceed a surface impurity concentration of $10^{20}$/cm$^3$;
   (c) performing a gettering process by diffusing n-type impurities in two surfaces of a pnpn wafer having said n+-emitter;
   (d) annealing the pnpn wafer subjected to the gettering process in an inert gas at a temperature of 600° to 1,000° C. for up to 10 hours; and
   (e) diffusing a heavy metal to control a carrier lifetime in the pnpn wafer subjected to said gettering process.

* * * * *